(12) United States Patent
Weng et al.

(10) Patent No.: US 9,484,385 B2
(45) Date of Patent: Nov. 1, 2016

(54) METHOD FOR FABRICATING AN IMAGE SENSOR PACKAGE

(71) Applicant: VisEra Technologies Company Limited, Hsinchu (TW)

(72) Inventors: Jui-Ping Weng, Houlong Township, Miaoli County (TW); Jang-Cheng Hsieh, Hsinchu (TW); Tzu-Han Lin, Hsinchu (TW); Pai-Chun Peter Zung, Hsinchu (TW)

(73) Assignee: VisEra Technologies Company Limited, Hsinchu (TW)

( * ) Notice: Subject to any disclaimer, the term of this patent is extended or adjusted under 35 U.S.C. 154(b) by 0 days.

(21) Appl. No.: 14/948,871

(22) Filed: Nov. 23, 2015

(65) Prior Publication Data

US 2016/0079304 A1 Mar. 17, 2016

Related U.S. Application Data

(62) Division of application No. 11/882,441, filed on Aug. 1, 2007, now Pat. No. 9,231,012.

(51) Int. Cl.
*H01L 21/00* (2006.01)
*H01L 21/30* (2006.01)
*H01L 21/46* (2006.01)
(Continued)

(52) U.S. Cl.
CPC ....... *H01L 27/14683* (2013.01); *H01L 21/304* (2013.01); *H01L 21/76898* (2013.01);
(Continued)

(58) Field of Classification Search
CPC .......... H01L 27/14687; H01L 27/14621; H01L 27/14685; H01L 27/1469; H01L 27/14627; H01L 27/14636; H01L 27/1462; H01L 27/14625; H01L 27/14683; H01L 27/14618; H01L 2224/10; H01L 21/76898; H01L 25/50; H01L 24/81; H01L 21/304; H01L 21/76877; H01L 24/03; H01L 24/06; H01L 24/11; H01L 24/17
USPC ......... 438/65, 64, 70, 106, 118, 29, 66, 455, 438/459, 48
See application file for complete search history.

(56) References Cited

U.S. PATENT DOCUMENTS 6,168,965 B1 * 1/2001 Malinovich ....... H01L 27/14609
148/DIG. 12
6,169,319 B1 1/2001 Malinovich et al.
(Continued)

FOREIGN PATENT DOCUMENTS

TW 200425494 11/2004

OTHER PUBLICATIONS

The Office Action of the corresponding TW patent application issued on Sep. 27, 2011, 8 pages.

*Primary Examiner* — Shouxiang Hu
(74) *Attorney, Agent, or Firm* — Muncy, Geissler, Olds & Lowe, P.C.

(57) ABSTRACT

An image sensor package and method for fabricating the same is provided. The image sensor package includes a first substrate comprising a via hole therein, a driving circuit and a first conductive pad thereon. A second substrate comprising a photosensitive device and a second conductive pad thereon is bonded to the first substrate, so that the driving circuit, formed on the first substrate, can electrically connect to and further control the photosensitive device, formed on the second substrate. A solder ball is formed on a backside of the first substrate and electrically connects to the via hole for transmitting a signal from the driving circuit. Because the photosensitive device and the driving circuit are fabricated individually on the different substrates, fabrication and design thereof is more flexible. Moreover, the image sensor package is relatively less thick, thus, the dimensions thereof are reduced.

20 Claims, 7 Drawing Sheets

(51) Int. Cl.
  *H01L 27/146* (2006.01)
  *H01L 23/00* (2006.01)
  *H01L 21/304* (2006.01)
  *H01L 21/768* (2006.01)
  *H01L 25/00* (2006.01)

(52) U.S. Cl.
  CPC .............. *H01L24/06* (2013.01); *H01L 24/11* (2013.01); *H01L 24/17* (2013.01); *H01L 24/81* (2013.01); *H01L 25/50* (2013.01); *H01L 27/1464* (2013.01); *H01L 27/1469* (2013.01); *H01L 27/14618* (2013.01); *H01L 27/14621* (2013.01); *H01L 27/14625* (2013.01); *H01L 27/14627* (2013.01); *H01L 27/14636* (2013.01); *H01L 27/14685* (2013.01); *H01L 27/14687* (2013.01); *H01L 2224/10* (2013.01)

(56) References Cited

U.S. PATENT DOCUMENTS

| | | | |
|---|---|---|---|
| 6,800,943 | B2 | 10/2004 | Adachi |
| 7,425,460 | B2 | 9/2008 | Pain |
| 7,576,401 | B1 * | 8/2009 | de Guzman ........... G02B 7/021 |
| | | | 257/234 |
| 7,648,851 | B2 * | 1/2010 | Fu ..................... H01L 27/14609 |
| | | | 257/E31.02 |
| 2004/0245649 | A1 | 12/2004 | Imaoka |
| 2004/0256643 | A1 | 12/2004 | Chuang et al. |
| 2006/0289733 | A1 | 12/2006 | Zung et al. |
| 2007/0029654 | A1 | 2/2007 | Sunohara et al. |
| 2007/0052050 | A1 | 3/2007 | Dierickx |
| 2007/0267712 | A1 | 11/2007 | Fujita et al. |

\* cited by examiner

METHOD FOR FABRICATING AN IMAGE SENSOR PACKAGE

CROSS REFERENCE TO RELATED APPLICATIONS

This application is a Divisional of co-pending application Ser. No. 11/882,441, filed on Aug. 1, 2007, for which priority is claimed under 35 U.S.C. §120, the entire contents of which are hereby incorporated by reference.

BACKGROUND OF THE INVENTION

1. Field of the Invention

The invention relates to image sensor packages, and more particularly to an image sensor package with reduced dimensions and a method for fabricating the same.

2. Description of the Related Art

Charge coupled devices (CCD) and complementary metal oxide semiconductor (CMOS) image sensor devices are widely used in digital imaging applications. Consumers are familiar with image capture technology due to the proliferation of devices employing image sensor devices, including digital cameras, digital video recorders, image capture capable mobile phones, and monitors.

Figure 1:
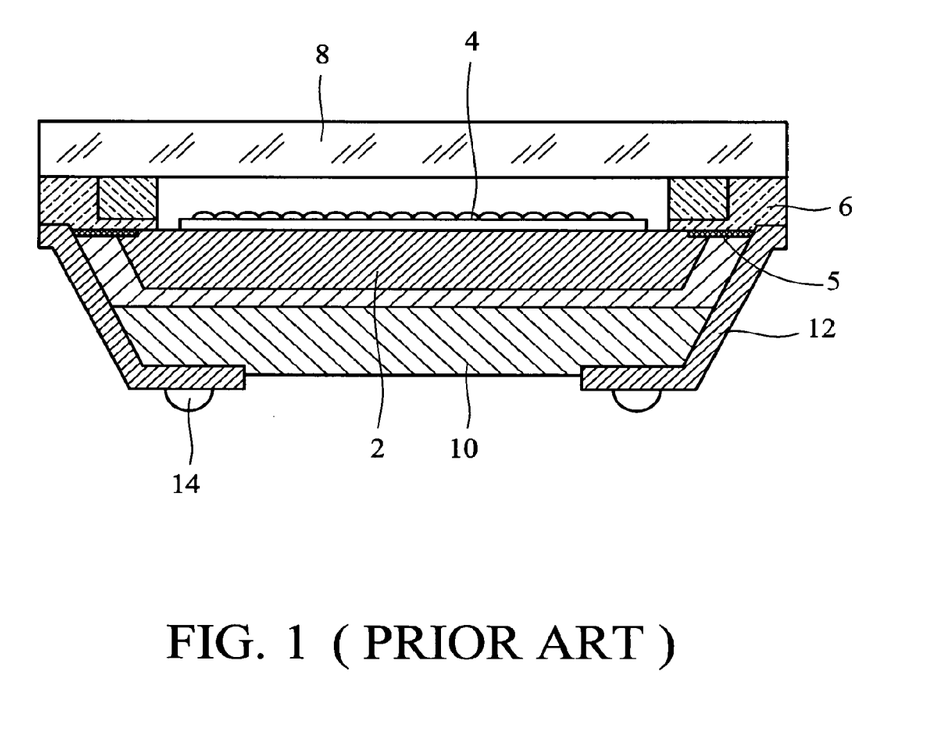
FIG. 1 is a cross section of a conventional image sensor package.

FIG. 1 shows a cross section of a conventional image sensor package. A chip 2 comprising an image sensor 4 and a bonding pad 5 thereon is provided. A covering plate 8 is attached to the chip 2 by an adhesive film 6. The chip 2 is disposed on a carrying substrate 10. A conductive layer 12 is subsequently formed on a lower surface of the carrying substrate 10 and is extended along a sidewall of the carrying substrate 10 to the bonding pad 5 to electrically connect a solder ball 14 and the bonding pad 5. The image sensor package has larger dimensions since both the chip and the carrying substrate, having certain thicknesses, exist in the image sensor package structure. Moreover, because the conductive layer is formed close to an exterior portion of the image sensor package, for example the sidewalls of the substrates, damage to the conductive layer may occur during the fabrication process.

Thus, an image sensor package and fabrication method thereof ameliorating the described problems is needed.

BRIEF SUMMARY OF INVENTION

Accordingly, the invention provides an image sensor package. An exemplary embodiment of the image sensor package comprises a first substrate comprising a first surface and second surface opposite to the first surface, in the first substrate a via hole is formed. A driving circuit is formed on the first surface of first substrate and is electrically connected to the via hole. A first conductive pad is formed on the first surface of the first substrate and is electrically connected to the driving circuit. A second substrate comprising a first surface and a second surface opposite to each other is bonded to the first surface of the first substrate. A photosensitive device and a second conductive pad is formed on the first surface of the second substrate, and the photosensitive device is electrically connected to the driving circuit formed on the first substrate, via the first and the second conductive pads. A support member and a covering plate are sequentially disposed on the second surface of the second substrate. A solder ball is formed on the second surface of the first substrate and is electrically connected to the via hole. The thickness and dimensions of the image sensor package is reduced because the second substrate with the photosensitive device formed thereon, and the first substrate with the via hole therein, are ground. Moreover, since the driving circuit and the photosensitive device are individually fabricated on different substrates, fabrication and design thereof are more flexible.

The invention also provides a method for fabricating an image sensor package. The method comprises providing a first substrate comprising a via hole therein; forming a driving circuit on the first substrate, which is electrically connected to the via hole; bonding a second substrate comprising a photosensitive device thereon to the first substrate to electrically connect the photosensitive device and the driving circuit; forming a support member on the second substrate; disposing a covering plate on the second substrate; and forming a solder ball on the first substrate, which is electrically connected to the via hole. The method further comprises thinning the first and second substrates to reduce the dimensions of the image sensor package.

The invention provides an image sensor package. The package comprises a first substrate comprising a first conductive pad thereon and a via hole therein, in which the first conductive pad electrically connects to the via hole; a second substrate comprising an image sensor device comprising a photosensitive device and a driving circuit, and a second conductive pad in contact with the first conductive pad formed on the first substrate, thereon; a support member formed on a backside of the second substrate; a covering plate disposed on the support member; and a solder ball formed on a backside of the first substrate, which is electrically connected to the via hole.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2A:
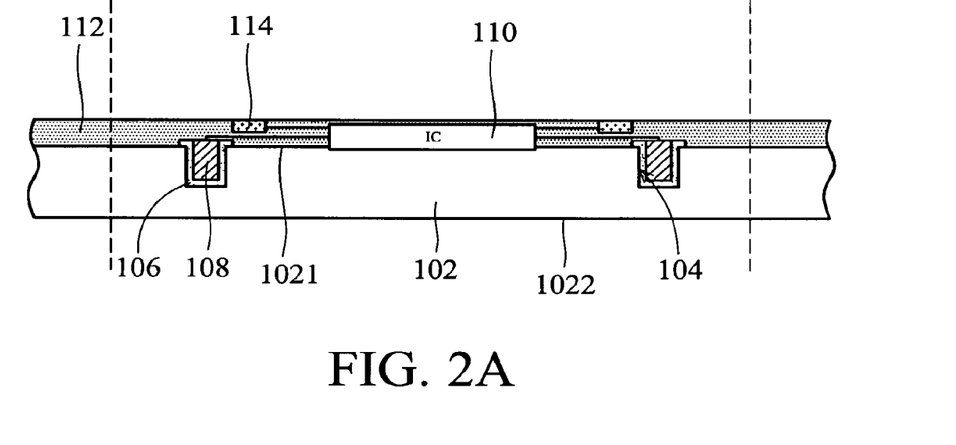
FIGS. 2A-2G are cross sections illustrating fabrication of an image sensor package according to a first, embodiment of the invention.

FIGS. 2A-2G are cross sections illustrating fabrication of an image sensor package according a first embodiment of the invention. Referring to FIG. 2A, a first substrate 102, also referred to as a carrying substrate, and a first surface 1021 and second surface 1022 opposite to each other, is provided. The first surface 1021, may be referred to as a frontside and the second surface 1022, as a backside. Preferably, the first substrate 102 is made of bulk silicon, silicon on insulator (SOI), or any other suitable semiconductor material.

A via hole 108 is formed in the first substrate 102. In one exemplary embodiment, etching the first surface 1021 of the first substrate 102 forms a cavity 104. An insulating material layer (not shown), such as silicon oxide, silicon nitride, or any suitable insulating material, is subsequently deposited on the first surface 1021 of the first substrate 102 and in the cavity 104, by chemical vapor deposition (CVD), low pressure chemical vapor deposition (LPCVD), or plasma enhanced chemical vapor deposition (PECVD). Next, the insulating material layer is patterned to form an insulating layer 106 in the cavity 104. A conductive material such as copper (Cu) is filled in the cavity 104 to form the via hole 108.

As shown in FIG. 2A, a driving circuit 110, electrically connected with the via hole 118, is formed on the first surface 1021 of the first substrate 102. In one embodiment, the driving circuit 110 is fabricated on the first surface 1021 of the first substrate 102 by a semiconductor process. Next, a dielectric layer 112 is blanketly formed on the first substrate 102 to cover the driving circuit 110 and the via hole 108. A first conductive pad 114 is subsequently formed on the dielectric layer 112 over the first substrate 102, by a metallization process and is electrically connected to the driving circuit 110. Preferably, the conductive pad 114 is copper (Cu), aluminum (Al), or any other suitable conductive material.

Figure 2B:
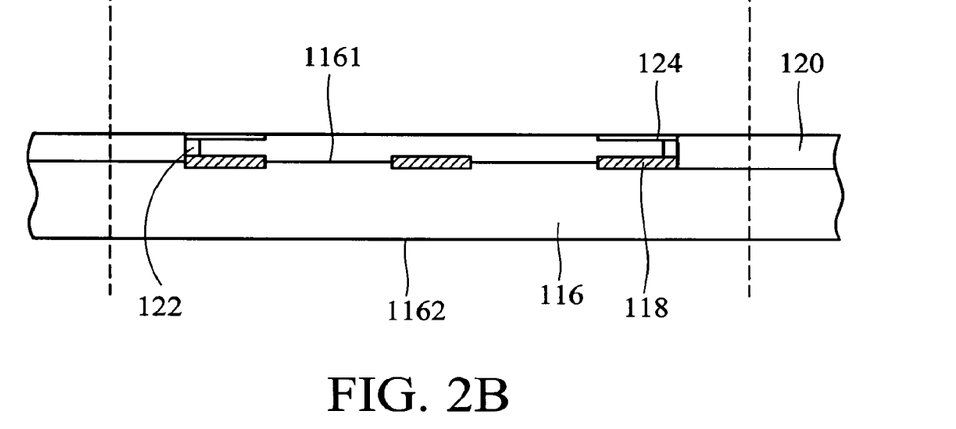

Referring to FIG. 2B, a second substrate 116 comprising a first surface 1161 and a second surface 1162 is provided. Preferably, the material of the second substrate 116 is the same as the first substrate. The first surface 1161, may be referred to as a frontside and the second surface 1162, as a backside. A photosensitive device 118 is formed on the first surface 1161 of the second substrate 116, by CMOS process. Thus, the second substrate 116 may also be referred to as a photosensitive device substrate. In one embodiment, the photosensitive device 118 can be a CMOS device or a CCD (charge-coupled device) for capturing pictures or other images. Next, an interlayer dielectric 120 is subsequently formed on the first surface 1161 of the second substrate 116 to cover the photosensitive device 118.

Thereafter, a metal plug 122, for example copper (Cu), aluminum (Al) or tungsten (W), is formed in the interlayer dielectric 120 and electrically connects the photosensitive device 118 and a second conductive pad 124 later formed over the first surface 1161 of the second substrate 116, as shown in FIG. 2B.

Figure 2C:
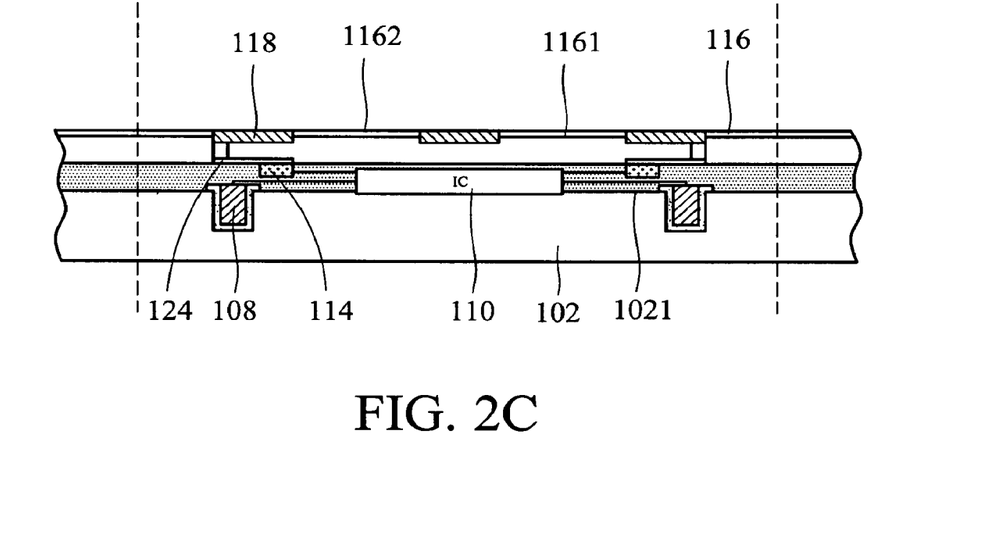

Referring to FIG. 2C, the second substrate 116 is bonded to the first substrate 102 to electrically connect the driving circuit 110 formed on the first substrate 102 to the photosensitive device 118 formed on the second substrate 116. In some embodiments, an adhesive agent (not shown) such as epoxy is coated over the first surface 1161 of second substrate 116 followed by bonding the second substrate 116 to the first surface 1021 of the first substrate 102, so that the second conductive pad 124 can be in contact or electrically connected with the first conductive pad 114. Thus, the driving circuit 110, which is formed on the first surface 1021 of the first substrate 102, can couple with and further control the photosensitive device 118, which is formed on the first surface 1161 of the second substrate 116. In one embodiment, an adhesive agent capable of conductivity, for example anisotropic conductive film (ACF) may also be used to bond the second substrate 116 to the first substrate 102.

Next, a portion of the second substrate 116 is removed to allow a relatively large amount of light to penetrate into the photosensitive device 118. In some embodiments, the second surface 1162 of the second substrate 116 is polished or ground to thin out the second substrate 116, so that the photosensitive device 118 can sense a sufficient light through its backside to produce a signal and then transmit the signal to the driving circuit 110. The polishing and grounding may be performed by chemical mechanical polishing (CMP) process.

Note that the second substrate 116 is thinned to an appropriate thickness, allowing the photosensitive device 118 to sense only a sufficient amount of light through the residual second substrate 116. Thus, the residual thickness of the second substrate 116 is not provided. Moreover, the overall thickness of the image sensor package is reduced because of the thinning.

Figure 2D:
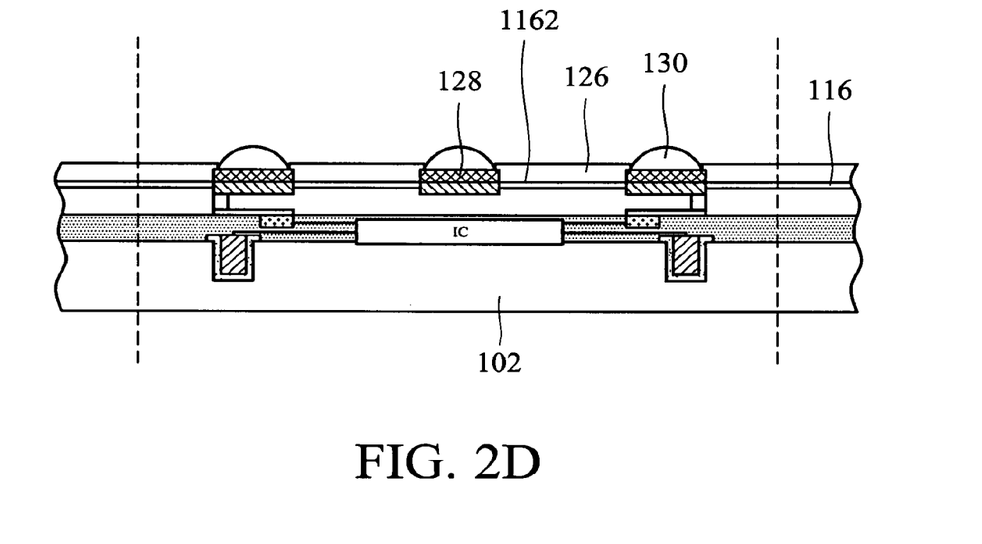

Referring to FIG. 2D, after the thinning, a color filter layer 128 is formed on the photosensitive device 118. An overcoating layer 126 is subsequently formed on the second surface 1162 of the second substrate 116. In one embodiment, the color filter layer 128 is formed on the backside of the photosensitive device 118. The overcoating layer 126, such as propylene glycol methyl ether acetate (PMA), propylene glycol ethyl ether acetate, or acrylic acid polymer, is then coated on the second surface 1162 of the second substrate 116 and covers the color filter layer 128. A portion of the overcoating layer 126 is subsequently removed to expose the color filter layer 128.

Next, an optics element 130 such as a micro lens is disposed on the color filter layer 128. Preferably, the micro lens is a material made of phenolic resin, melamine resin, epoxy resin, or any suitable material. Note that the optics element 130 may also be formed on the overcoating layer 126 over the color filter 128 without removing the overcoating layer 126.

Figure 2E:
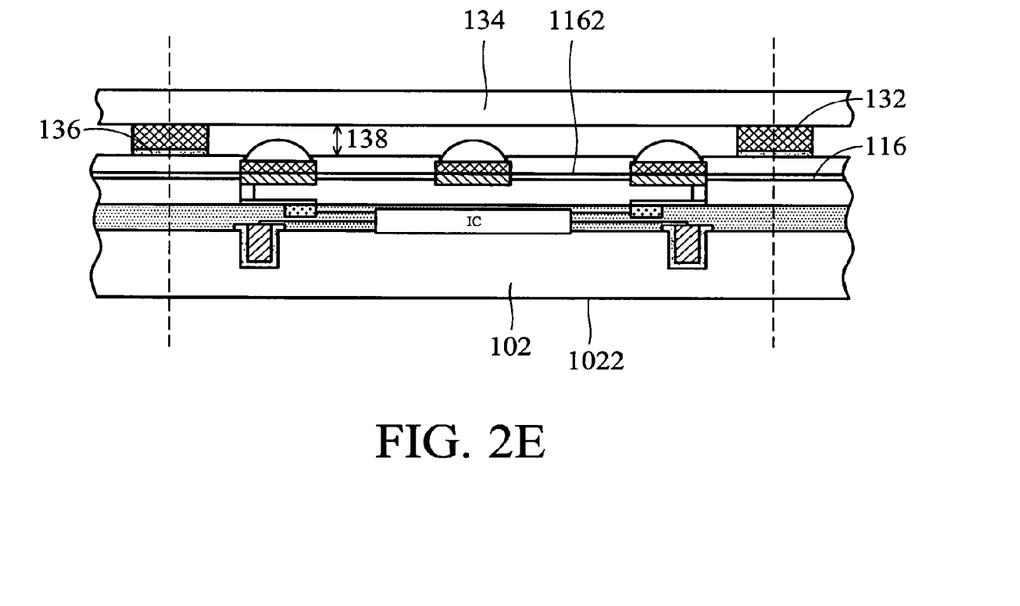

Referring to FIG. 2E, a covering plate 134 is disposed on the second surface 1161 of second substrate 116 to form a distance 138 therebetween. In one embodiment, a support member 132, also referred to as a support dam, is formed on the covering plate 134. An adhesive film 136 is coated on the support member 132 followed by attaching the covering plate 134 to the second substrate 116 to form the support member 132 on the second surface 1162 of the second substrate 116. In another embodiment, the support member 132 may also be formed on the overcoating layer 126 followed by attaching the covering plate 134 to the second substrate 116 by the adhesive film 136. Thus, the described is provided merely as an example and the invention is not limited thereto.

In some embodiments, the covering plate 134 may preferably be a transparent substrate such as glass, quartz, opal, or plastic. Preferably, support member 132 is a material made of polyimide (PI), epoxy, or photoresist material.

Thereafter, a portion of the first substrate 102 and the insulating layer 106 is subsequently removed to expose the via hole 108. In one embodiment, the first substrate 102 is polished or ground from its second surface 1022 to expose the via hole 108.

Figure 2F:
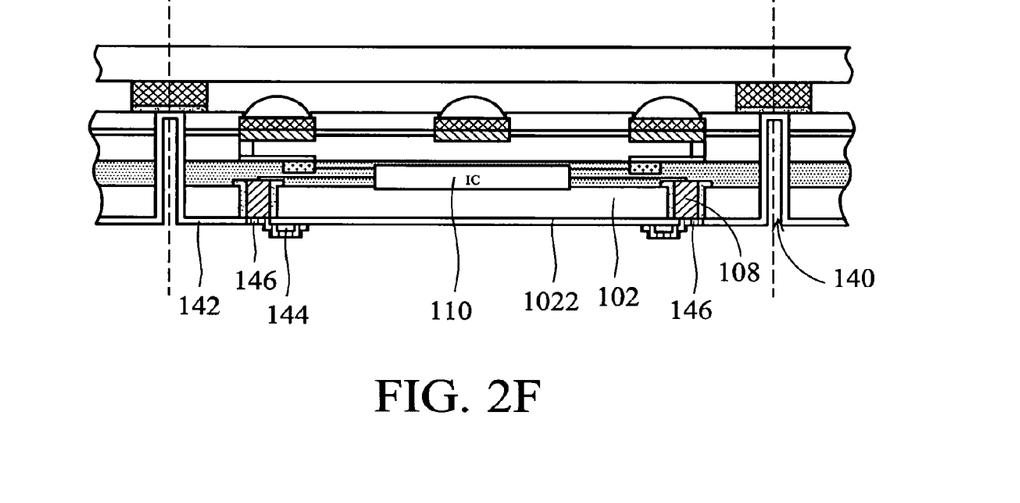

Referring to FIG. 2F, after the described steps, a trench 140 is subsequently formed in the first substrate 102 by notching. An insulating layer 142, such as silicon oxide, silicon nitride, silicon oxynitride, photoresist material or any other suitable material, is blanketly formed on the second surface 1022 of the first substrate 102 and extended to the bottom surface and sidewalls of the trench 140, by CVD, LPCVD, PECVD or coating.

Next, a cushioning layer 144 such as polyimide (PI) is formed on the second surface 1022 of the first substrate 102. A conductive layer 146 is then formed on the second surface 1022 of the first substrate 102 and is electrically connected to the via hole 108. In some embodiments, a portion of the insulating layer 142 is removed to expose the via hole 108 prior to forming the conductive layer 146. A conductive material layer, such as aluminum, copper, nickel or any other suitable conductive material, is then formed blanketly on the second surface 1022 of the first substrate 102 and covers the cushioning layer 144, by sputtering, evaporating, electroplating or PECVD. The conductive material layer is patterned to form the conductive layer 146. By patterning the conductive material layer, the driving circuit 110 signal conductive path may be redistributed.

Note, that because the conductive layer 146 electrically connects to the driving circuit 110 via the via hole 108 formed in the first substrate 102, the conductive layer 146 need not be formed in the trench 140. Thus, fabrication of the conductive layer 146 is simpler. Moreover, the conductive path of signal is shortened because of the via hole 108.

Figure 2G:
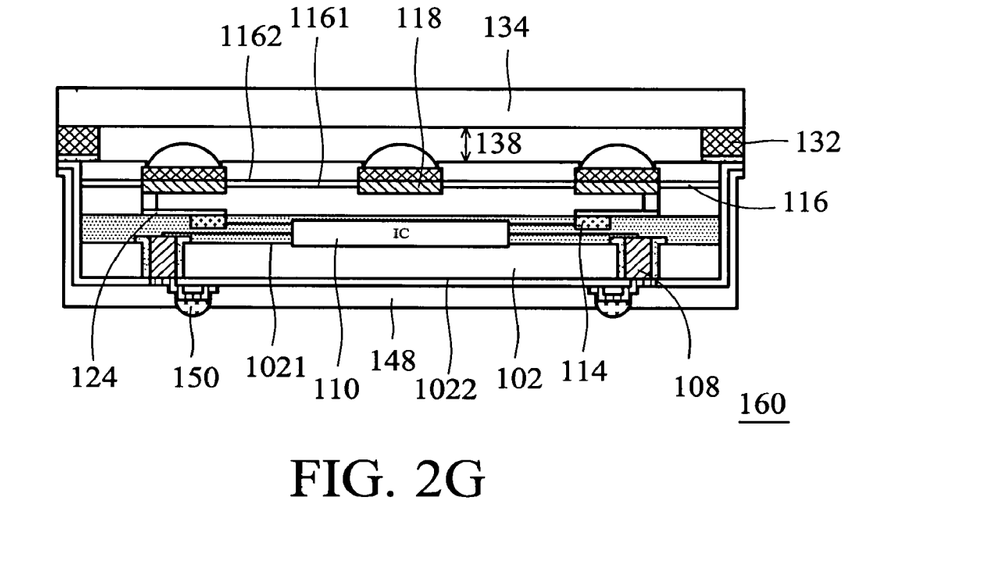

Referring to FIG. 2G, a solder mask layer 148, also referred to as a protective layer, is formed on the conductive layer 146 and the insulating layer 142, and then patterned to expose a portion of the conductive layer 146 where a solder ball 150 is subsequently formed. The solder ball 150 is formed on the exposed conductive layer 146 to electrically connect to the via hole 108. In some embodiments, a solder material (not shown) is coated on the exposed conductive layer 146 and a reflow step is subsequently performed to form the solder ball 150. Subsequent to the previously described steps, an individual die is then cut out along the predetermined cutting line thereof by a cutter. Thus, fabrication of an image sensor package 160, as shown in FIG. 2G, is complete.

Note that the overall image sensor package according to the first embodiment of the invention is thinner than the conventional because both the first and second substrates are thinned by grinding. Thus, the dimensions of the image sensor package are reduced. Furthermore, the fabrication and layout of the metal plug do not affect the sensitive surface of the photosensitive device because the sensitive surface of the photosensitive device is disposed on one side opposite to the side for the metal plug. Thus, fabrication and layout of the metal plug is more flexible. That is, the metal plug is formed on the first surface of the second substrate (which is then bonded to the first substrate) and the backside of the photosensitive device is utilized to sense light. Thus, the sensitive surface of the photosensitive device is opposite the surface where the metal plug is located, so that the fabrication and design of the metal plug is more flexible.

In the image sensor package, the conductive layer is formed on a backside (the second surface) of the first substrate and is electrically connected to the driving circuit through the via hole in the first substrate rather than formed on the sidewalls of the image sensor package. Thus, the damage to the conductive layer caused during fabrication, for example cutting, is reduced and the image sensor package yield can be improved. Moreover, because the driving circuit utilized to control the photosensitive device is formed on the first substrate, thus, it is not necessary to form driving circuits on the second substrate. Specifically, the first substrate, in which the via hole and the driving circuit are formed, and the second substrate, on which the photosensitive device is formed, may be fabricated individually and independently, so that the design of the driving circuit and the photosensitive device is more flexible. The first substrate may also be referred to as a circuit substrate and the second substrate may also be referred to as a photosensitive device substrate.

Furthermore, because the photosensitive device senses light from the backside thereof, the metal plug and the conductive pad formed on the first surface (opposite to the backside of the photosensitive device) of the second substrate have more flexibility when being fabricated. Similarly, the conductive pad, the driving circuit and the via hole have less restrictions for placement, and they can be formed on any area of the first substrate.

Figure 3:
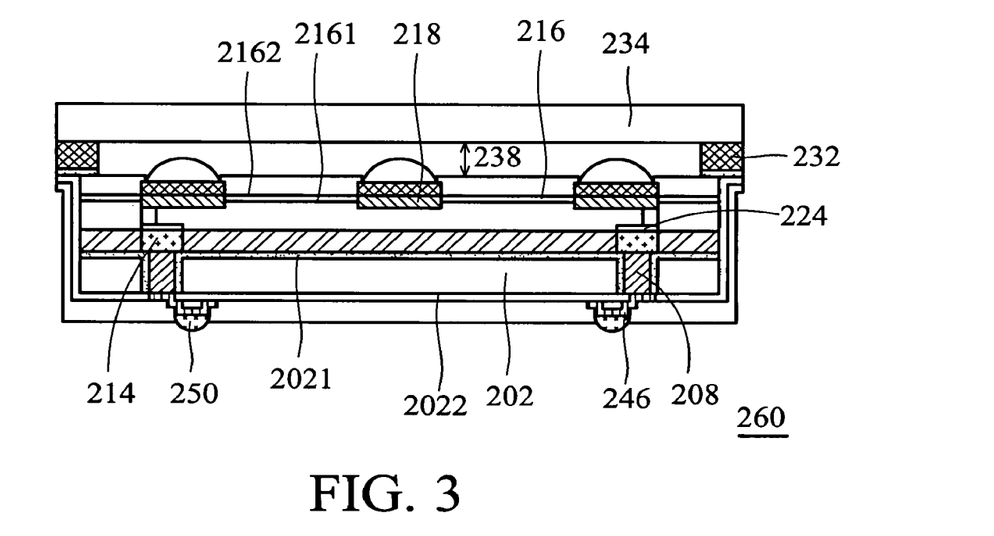
FIG. 3 is a cross section of an image sensor package according to a second embodiment of the invention.

FIG. 3 is a cross section of an image sensor package according to a second embodiment of the invention. The difference between the first and second embodiments is the driving circuit. In second embodiment, the driving circuit is fabricated on a second substrate with a photosensitive device formed thereon. Descriptions of similar elements and formations thereof have been provided in the first embodiment, and thus, further descriptions are not provided here.

Referring to FIG. 3, a first substrate 202 comprising a first surface 2021 and a second surface 2022 is provided with a via hole 208 formed therein. The first surface 2021, may be referred to as a frontside and the second surface 2022, as a backside. Next, a first conductive pad 214 is formed on the first surface 2021 of the first substrate 202 and is in contact with the via hole 208. Note that the via hole 208 and the first conductive pad 214 can be placed separately at any place on the first substrate 202 and that the only requirement is both electrically connected.

Additionally, a second substrate 216 comprising a first surface 2161 and a second surface 2162 is bonded to the first substrate 202 by, for example an adhesive agent. An image sensor device comprising a photosensitive device 218 and a driving circuit is formed on the first surface 2161 of the second substrate 216 prior to bonding, and is electrically connected to a second conductive pad 224. That is, the driving circuit and the photosensitive device are fabricated on the same substrate. The first conductive pad 214 is in contact with the second conductive pad 224 by bonding and is electrically connected thereto. Similarly, the second substrate 216 is ground to an appropriate thickness, so that the image sensor device can sense a sufficient amount of light through its backside.

Next, a support member 232 is formed on the second surface 2162 of the second substrate 216 and a covering plate 234 is then disposed on the second substrate 216 to form a distance 238 therebetween. A conductive layer 246 is formed on the second surface 2022 of first substrate 202 and electrically connects to a solder ball 250 later formed. After the described steps above, the fabrication of image sensor package 260 according to the second embodiment of the invention, as shown in FIG. 3, is complete.

Similar to the first embodiment of the invention, the image sensor package of the second embodiment has reduced dimensions because the first and second substrates are ground. Moreover, to sense light, the image sensor device can utilize its backside opposite the surface where a metal plug is located. Accordingly, the fabrication and layout of the metal plug are more flexible.

In the image sensor package according to the second embodiment of the invention, the photosensitive device 218 can sense light through the backside thereof, and produce a signal. The signal from the photosensitive device 218 is sent to the driving circuit formed on the second substrate 216.

Next, the signal from the second substrate 216 is transmitted to the via hole 208 in the first substrate 202 through the contacted conductive pads 224 and 214, and subsequently to the conductive layer 246 and the solder ball 250. Note that the conductive path of the signal is shortened because of the via hole formed in the first substrate.

Figure 4:
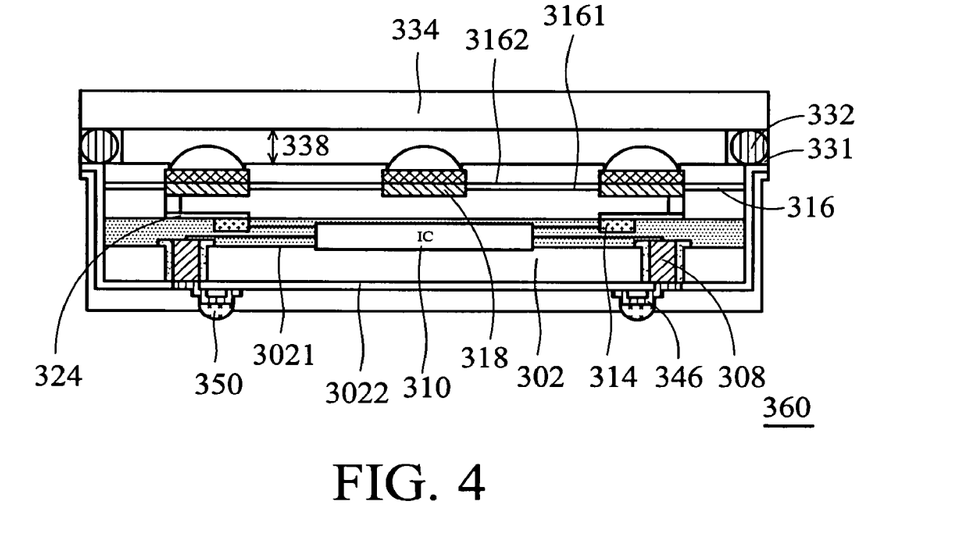
FIG. 4 is a cross section of an image sensor package according to a third embodiment of the invention.

FIG. 4 is a cross section of an image sensor package according to a third embodiment of the invention. The difference between the first and third embodiments is the support member. Descriptions of the elements and formations thereof have been provided in the first embodiment, and thus, further descriptions are not provided here.

Referring to FIG. 4, a first substrate 302 comprising a first surface 3021 and a second surface 3022 is provided with a via hole 308 formed therein. A driving circuit 310 with electrical connection to the via hole 308, is formed on the first surface 3021 of the first substrate 302. A second substrate 316 comprising a first surface 3161 and second surface 3162 is bonded to the first substrate 302 to electrically connect the driving circuit 310 to the photosensitive device 318 which has been formed on the first surface 3161 of-the-second-substrate 316. By bonding, the photosensitive device 318 formed on the second substrate 316 is further controlled through the driving circuit 310 formed on the first substrate 302. Specifically, the photosensitive device 318 and the driving circuit 310 are fabricated on different substrates.

A support member 332 is formed on the second surface 3162 of the second substrate 316. Next, a covering plate 334 is then disposed on the second substrate 316 to form a distance 338 therebetween. In one embodiment, an adhesive material 331 containing the support member 332 such as spherical spacers or roller spacers is coated on the covering plate 334 followed by attachment of the covering plate 334 to the second substrate 316. Thereafter, a solder ball 350 is formed on the second surface 3022 of the first substrate 302 and is electrically connected to the via hole 308 by a conductive layer 346. After the described steps, the fabrication of an image sensor package 360 according to the third embodiment of the invention, as shown in FIG. 4, is complete.

Note that the support member such as spherical spacers or roll spacers according to the third embodiment, may be used in the other types of image sensor packages for separating and maintaining a distance between the covering plate and die. Furthermore, because the additional step for forming the support member is eliminated, the number of fabrication processes is reduced.

Figure 5:
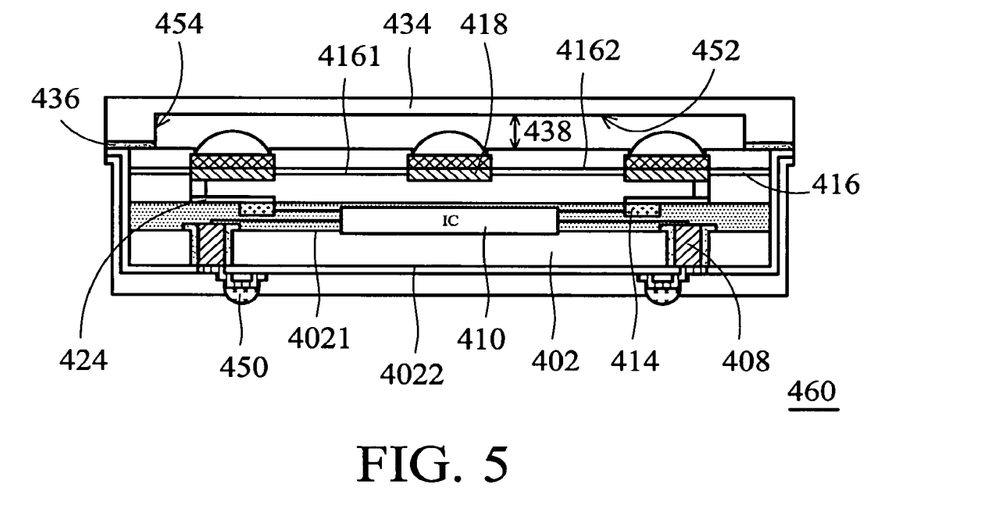
FIG. 5 is a cross section of an image sensor package according to a fourth embodiment of the invention.

FIG. 5 is a cross section of an image sensor package according to a fourth embodiment of the invention. The difference between the first and fourth embodiments is the support member, which is a protruding part of a covering plate. Descriptions of the elements and the formations thereof have been provided in the first embodiment, and thus, repeated descriptions are not provided here.

Referring to FIG. 5, after bonding the second substrate 416 to the first substrate 402, a covering plate 434 comprising a protruding part 454 is disposed on the second-surface 4162 of the second substrate 416 to form a distance 438 therebetween. In some embodiments, the covering plate 434 is etched to form a recess 452 and the protruding part 454 prior to disposing. Note that the dimensions of the recess 452 may be substantially larger than an area where the photosensitive device 418 is located. The protruding part 545 may have a suitable height from a bottom of the recess 452 to a top surface of the protruding part 545 to maintain the distance 438. Next, an adhesive layer 436 is coated on the protruding part 545 of the covering plate 434 followed by attachment of the covering plate 434 to the second substrate 416. Thereafter, an image sensor package 460, as shown in FIG. 5, is complete along with specific steps previously described in the first embodiment.

Because the protruding part of the covering plate serves as a support member, extra material for the support member is not needed. Moreover, warpage phenomenon of the image sensor package caused by the difference between coefficients of thermal expansion (CTE) of various materials is reduced because the material of the protruding part as the support member is the same as the covering plate.

Note that the support member, which comprises a spherical spacer in the third embodiment or a protruding part of a covering plate in the fourth embodiment, may be used in the image sensor package of the second embodiment.

Figure 6:
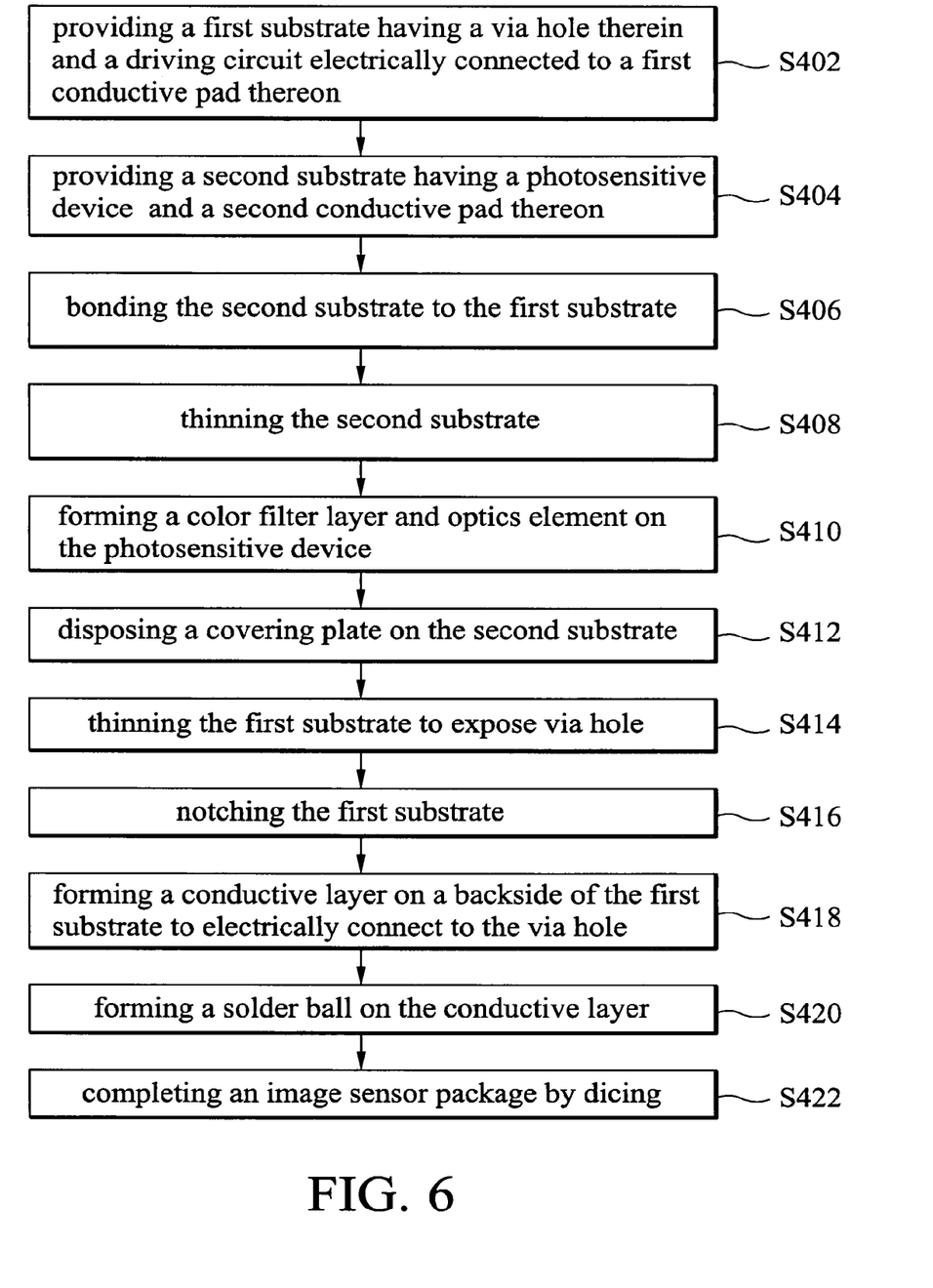
FIG. 6 is a flowchart of a method for fabricating an image sensor package according to an embodiment of the invention.

FIG. 6 is a flowchart for fabricating an image sensor device package according to an embodiment of the invention. A method for fabricating the image sensor device package comprises: providing a first substrate comprising a via hole therein and a driving circuit electrically connected to a first conductive pad thereon, as shown in S402; providing a second substrate comprising a photosensitive device and a second conductive pad thereon, as shown in S404; bonding the second substrate to the first substrate to electrically connect the photosensitive device formed on the second substrate, and the driving circuit formed on the first substrate, through the contacted conductive pads, as shown in S406; thinning the second substrate, as shown in S408, so that only sufficient light can penetrate and be sensed through a backside of the photosensitive device; forming a color filter layer and an optics element on the photosensitive device, as shown in S410; disposing a covering plate on the second substrate to form a distance and a support member therebetween, as shown in S412; thinning the first substrate to expose the via hole, as shown in S414; notching the first substrate, as shown in S416; forming a conductive layer on a backside of the first substrate to electrically connect to the via hole, as shown in S418; forming a solder ball on the conductive layer, as shown in S420; completing an image sensor package by dicing, as shown in S422.

While the invention has been described by way of example and in terms of preferred embodiment, it is to be understood that the invention is not limited thereto. To the contrary, it is intended to cover various modifications and similar arrangements (as would be apparent to those skilled in the Art). Therefore, the scope of the appended claims should be accorded the broadest interpretation so as to encompass all such modifications and similar arrangements.

What is claimed is:

1. A method for fabricating an image sensor package, comprising:
   providing a first substrate comprising a via therein, wherein the first substrate comprises an upper surface and a lower surface opposite the upper surface;
   forming a driving circuit on the upper surface of the first substrate and electrically connected to the via;
   bonding a second substrate to the first substrate, wherein the second substrate comprises a first surface and a second surface opposite the first surface, and wherein a photosensitive device is on the first surface and is electrically connected to the driving circuit;
   forming a support member on the second surface of the second substrate; and
   disposing a covering plate on the second surface of the second substrate.

2. The method as claimed in claim 1, wherein further comprising:
   etching the first substrate to form a cavity; and
   filling a conductive material in the cavity to form the via.

3. The method as claimed in claim 1, further comprising:
forming a first conductive pad on the upper surface of the first substrate electrically connected to the driving circuit; and
forming a second conductive pad on the first surface of the second substrate electrically connected to the photosensitive device;
wherein the first conductive pad is in contact with the second conductive pad to electrically connect the driving circuit to the photosensitive device by the bonding.

4. The method as claimed in claim 3, further comprising:
forming an interlayer dielectric on the second substrate prior to bonding; and
forming a metal plug in the interlayer dielectric electrically connected the photosensitive device and the second conductive pad.

5. The method as claimed in claim 1, further comprising thinning the first substrate from the lower surface to expose the via.

6. The method as claimed in claim 5, wherein thinning the first substrate is performed by grinding.

7. The method as claimed in claim 1, further comprising thinning the second substrate to make the photosensitive device capable of sensing a sufficient amount of light through the second surface.

8. The method as claimed in claim 1, wherein forming the support member comprises:
removing a portion of the covering plate to form a recess and a protruding part; and
disposing the covering plate on the second substrate.

9. The method as claimed in claim 1, further comprising:
forming a color filter layer on the photosensitive device; and
disposing an optics element on the color filter layer.

10. The method as claimed in claim 1, further comprising forming a solder ball on the lower surface of the first substrate and electrically connected to the via.

11. The method as claimed in claim 1, wherein the photosensitive device senses light through a backside thereof.

12. The method as claimed in claim 1, further comprising forming a conductive layer on the lower surface of the first substrate.

13. The method as claimed in claim 12, further comprising forming a solder ball on the lower surface of the first substrate, and wherein the via and the solder ball are electrically connected through the conductive layer.

14. The method as claimed in claim 1, further comprising forming a solder mask on the lower surface of the first substrate.

15. The method as claimed in claim 1, further comprising forming a trench extending from the first substrate towards the support member.

16. The method as claimed in claim 15, wherein forming the trench is performed by notching.

17. The method as claimed in claim 15, wherein the trench penetrates through the second substrate.

18. The method as claimed in claim 15, further comprising forming an insulating layer on the lower surface of the first substrate and extending into the trench.

19. The method as claimed in claim 1, further comprising removing a portion of the second substrate to allow a sufficient amount of light to penetrate into the photosensitive device.

20. The method as claimed in claim 19, wherein the removal of the portion of the second substrate is performed after bonding the second substrate to the first substrate.

* * * * *